US012591012B2

(12) United States Patent
Al Mouatamid

(10) Patent No.: US 12,591,012 B2
(45) Date of Patent: Mar. 31, 2026

(54) ONBOARD MONITORING OF SIGNAL DELAY

(71) Applicant: VOLVO TRUCK CORPORATION, Gothenburg (SE)

(72) Inventor: Faouzi Al Mouatamid, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 0 days.

(21) Appl. No.: 18/962,497

(22) Filed: Nov. 27, 2024

(65) Prior Publication Data

US 2025/0189588 A1 Jun. 12, 2025

(30) Foreign Application Priority Data

Dec. 8, 2023 (EP) .................................... 23215175

(51) Int. Cl.
| | |
|---|---|
| *G01R 31/36* | (2020.01) |
| *B60R 16/033* | (2006.01) |
| *G01R 31/382* | (2019.01) |
| *G07C 5/08* | (2006.01) |

(52) U.S. Cl.
CPC ........ *G01R 31/3644* (2013.01); *B60R 16/033* (2013.01); *G01R 31/382* (2019.01); *G07C 5/0816* (2013.01)

(58) Field of Classification Search
CPC .............. G01R 31/3644; G01R 31/382; B60R 16/033; G07C 5/0816
USPC ........................................................ 307/9.1
See application file for complete search history.

(56) References Cited

U.S. PATENT DOCUMENTS

| | | | |
|---|---|---|---|
| 5,488,283 A | 1/1996 | Dougherty et al. | |
| 9,475,439 B2 * | 10/2016 | Fetzer ...................... | B60L 58/10 |
| 10,811,897 B2 * | 10/2020 | Maekawa ................. | H02J 7/00 |
| 2002/0109407 A1 * | 8/2002 | Morimoto ............... | B60L 50/16 |
| | | | 903/917 |
| 2014/0111160 A1 * | 4/2014 | Nozawa ............... | G01R 31/007 |
| | | | 320/167 |
| 2015/0329006 A1 | 11/2015 | Burkman et al. | |
| 2017/0197565 A1 * | 7/2017 | Yoneyama .......... | B60R 16/0238 |

(Continued)

FOREIGN PATENT DOCUMENTS

| | | |
|---|---|---|
| JP | H10243566 A | 9/1998 |
| KR | 20180028239 A | 3/2018 |
| KR | 20190028941 A | 3/2019 |

OTHER PUBLICATIONS

Extended European Search Report in corresponding European Application No. 23215175.3 dated Jun. 26, 2024 (5 pages).

*Primary Examiner* — Alfonso Perez Borroto
(74) *Attorney, Agent, or Firm* — Jeffri A. Kaminski; Venable LLP

(57) ABSTRACT

A method of monitoring signal delay at a battery of a vehicle utilizes a switching circuitry. The switching circuitry has a first path comprising a first switch, a second path comprising a second switch, a parallel third path comprising a third switch and a resistor in series with the third switch. The method includes closing the first switch and opening the second switch closing the third switch detecting a change in an electric property of the battery in response to the closing of the third switch and determining the signal delay by determining a delay in the detected change in the electric property in response to the closing of the third switch.

20 Claims, 3 Drawing Sheets

(56) References Cited

U.S. PATENT DOCUMENTS

2018/0041048 A1\*  2/2018  Yang ........................ B60R 16/03
2018/0069411 A1\*  3/2018  Kim ......................... B60L 50/64

\* cited by examiner

ONBOARD MONITORING OF SIGNAL DELAY

TECHNICAL FIELD

The disclosure relates generally to measurement technology at a battery of a vehicle. In particular aspects, the disclosure relates to onboard monitoring of signal delay. The disclosure can be applied to heavy-duty vehicles, such as trucks, buses, and construction equipment, among other vehicle types. Although the disclosure may be described with respect to a particular vehicle, the disclosure is not restricted to any particular vehicle.

BACKGROUND

Measuring electrical properties of a battery system of a vehicle are essential for maintaining the overall health of the battery system and ensuring the reliable operation of the vehicle. In many situations, it is important to know the magnitude of a certain parameter at a certain time. A signal delay in the sensor measurement may lead to inaccurate readings, especially when detecting sudden behavior such as drops or spikes. Consequently, a signal delay may potentially impact the overall maintenance of the battery and thereby also the health of the battery.

In current solutions, the signal delay is obtained in a lab environment prior to installing the sensors onboard the vehicle. A potential drawback of such solution is the inability to check the signal delay without removing the sensors from the vehicle, which in turn makes it difficult to systematically monitor the delay signal for potential errors.

Consequently, there is a need for a method of monitoring a signal delay at a battery of a vehicle.

SUMMARY

According to a first aspect of the disclosure, there is provided an electronic control unit configured to monitor signal delay at a battery of a vehicle by utilizing a switching circuitry, the switching circuitry comprising a first path comprising a first switch configured to be controlled to selectively connect the battery to a load, a second path comprising a second switch configured to be selectively connect the battery to the load, a third path comprising a third switch configured to selectively connect the battery to the load and a resistor in series with the third switch, the third path being connected in parallel with the second path, the electronic control unit being configured to close the first switch and open the second switch, close the third switch, detect a change in an electric property of the battery in response to the closing of the third switch, determine the signal delay by determining a delay in the detected change in the electric property in response to the closing of the third switch.

The first aspect of the disclosure may seek to provide a method for monitoring a signal delay. At the time instance of closing the third switch, a change in the switching circuitry will occur in response to the switching circuitry transitioning into a current conducting state. In an ideal situation, the change would be detected at the time instance of closing the third switch. However, due to measurement delays, the change will be detected at a later time instance. Consequently, the signal delay may be easily derived by comparing the time instance of closing the third switch and the later time instance of detecting the change. A technical benefit may thus include an easy method for determining a delay by using a switching circuitry. Since the switching circuitry is readily implemented in the vehicle, a further technical benefit may include a method for determining a delay onboard a vehicle, without the need of removing the sensors or introducing additional equipment. It follows that a further technical benefit may include easy systematic monitoring of the signal delay.

Optionally in some examples, including in at least one preferred example, the third switch is being closed at a first time instance, and the change is represented by a peak in current passing through the resistor, the current being detected at a second time instance.

Optionally in some examples, the third switch is being closed at a first time instance, and the change is represented by the current passing through the resistor exceeding a set current threshold value, the current being detected at a second time instance.

Optionally in some examples, including in at least one preferred example, the signal delay is determined by computing a time difference between the first time instance and the second time instance. A technical benefit may include obtaining the signal delay for the sensor channel measuring the current.

Optionally in some examples, including in at least one preferred example, the third switch is being closed at a first time instance, and wherein the change is represented by peak in voltage over the battery, the change in the voltage is measured at a third time instance.

Optionally in some examples, the third switch is being closed at a first time instance, and the change is represented by the voltage over the battery exceeding a set voltage threshold value, the voltage being detected at a second time instance.

Optionally in some examples, including in at least one preferred example, the signal delay is determined for signals passing through the battery by computing a time difference between the first time instance and the third time instance. A technical benefit may include obtaining the signal delay for the sensor channel measuring the voltage.

Optionally in some examples, including in at least one preferred example, the determining of signal delay comprises determining the signal delay by computing a time difference between the second time instance and the third time instance.

By this feature, the signal delay between two different sensor channels is obtained. A delay between two or more different sensor channels may result in propagating errors when using the measurements in further calculations. As an example, assume that we wish to calculate the electrical power P at a second time instance t2. To do this, we measure the current I with one sensor channel and the voltage in another sensor channel. However, since there is a delay between the sensor channels, the value of the current I will be obtained for a second time instance t2 and the value of the voltage V will be obtained for a third time instance t3 due to the undesired signal delay Dt=t3−t2. A corresponding calculation of electrical power P=V(t3)*I(t2) will thus generate an erroneous result. A technical benefit of obtaining the signal delay may include the ability to compensate for any measurement delay when processing electrical parameters of the battery, which in turn may improve the health of the battery due to more accurate processing. In the example above, an compensated electrical power P=V(t3−Dt)*I(t2) would yield a more accurate result.

Optionally in some examples, including in at least one preferred example, the voltage is detected for an individual cell of the battery.

Optionally in some examples, including in at least one preferred example, the current passing through the resistor is being indirectly detected by measuring the voltage over the resistor and taking into account a known resistance value of the resistor.

Optionally in some examples, including in at least one preferred example, the switching circuitry further comprises a capacitor arranged in parallel with the load, thereby forming a pre-charge circuit.

A pre-charge circuit is a circuit readily implemented in an electrical system of the vehicle. A technical benefit of using the pre-charge circuit for obtaining the signal delay may include that the signal delay may be obtained using an existing circuitry, without the need of implementing additional parts.

Optionally in some examples, including in at least one preferred example, the closing of the first switch, the opening of the second switch, and the closing of the third switch are performed during power-up of the vehicle as part of a pre-charge operation.

Optionally in some examples, including in at least one preferred example an alert is provided upon the signal delay exceeding a threshold. The signal delay exceeding a threshold may be an indication of a malfunction of system components of the switching circuitry, such as sensors or switches. A technical benefit of providing an alert may include drawing the attention of a user or a crew to the potential issue, such that a timely corrective measure may be taken.

According to a second aspect of the disclosure, there is provided a method of monitoring signal delay at a battery of a vehicle by utilizing a switching circuitry, the switching circuitry comprising a first path comprising a first switch configured to be controlled to selectively connect the battery to a load, a second path comprising a second switch configured to be controlled to selectively connect the battery to the load, a third path comprising a third switch configured to selectively connect the battery to the load and a resistor in series with the third switch, the third path being connected in parallel with the second path, the method comprising closing the first switch and opening the second switch, closing the third switch, detecting a change in an electric property of the battery in response to the closing of the third switch, determining the signal delay by determining a delay in the detected change in the electric property in response to the closing of the third switch.

According to a third aspect of the disclosure, there is provided a vehicle comprising the electronic control unit according to the second aspect.

According to a fourth aspect of the disclosure, there is provided a computer program product comprising program code for performing, when executed by the electronic control unit, the method according the first aspect.

According to a fifth aspect of the disclosure, there is provided a computer non-transitory computer-readable storage medium comprising instructions, which when executed by the electronic control unit, cause the electronic control unit to perform the method according the first aspect.

The disclosed aspects, examples (including any preferred examples), and/or accompanying claims may be suitably combined with each other as would be apparent to anyone of ordinary skill in the art. Additional features and advantages are disclosed in the following description, claims, and drawings, and in part will be readily apparent therefrom to those skilled in the art or recognized by practicing the disclosure as described herein.

BRIEF DESCRIPTION OF THE DRAWINGS

Examples are described in more detail below with reference to the appended drawings.

DETAILED DESCRIPTION

The detailed description set forth below provides information and examples of the disclosed technology with sufficient detail to enable those skilled in the art to practice the disclosure.

Figure 1A:
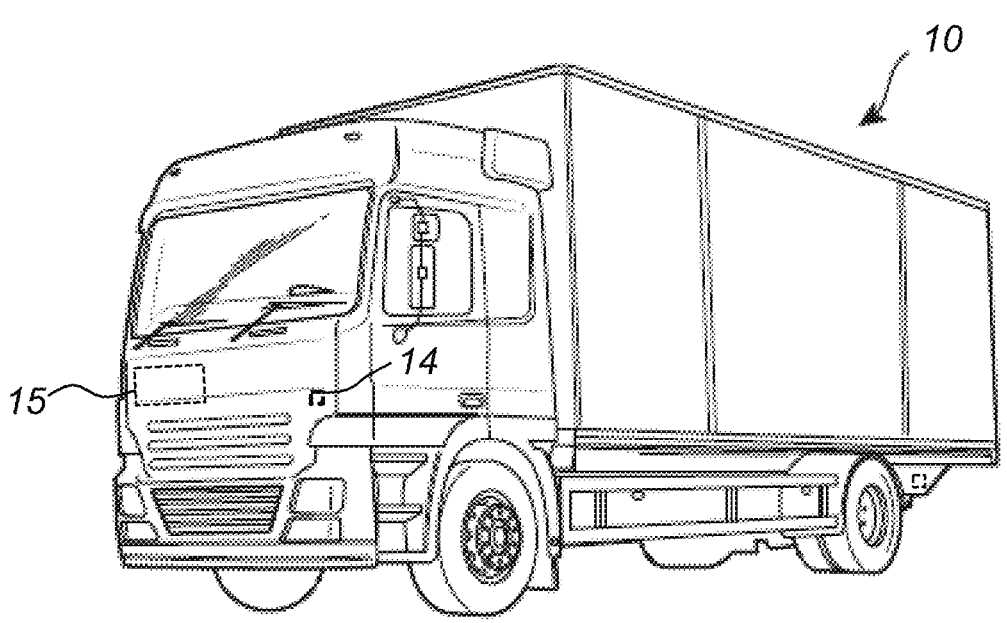
FIG. 1A illustrates a vehicle in the form of a truck in which examples of the present disclosure may be implemented.

FIG. 1A illustrates a vehicle in the form of a truck 10 in which examples of the present disclosure may be implemented, the truck 10 being equipped with a computer system 14, e.g. in the form of a so-called Electronic Control Unit (ECU) controlling operation of the truck 10.

Further illustrated in FIG. 1A is a rechargeable energy storage system 15 (REESS) arranged to provide electric energy for electric propulsion of the truck 10. The REESS 15 comprises a battery (to be further discussed hereinbelow) for providing electric energy for propulsion of the truck 10.

Although the vehicle 10 in FIG. 1A is depicted as a heavy-duty truck, examples of the present disclosure may be implemented in other types of vehicles, such as in passenger cars, busses, light-duty trucks, mid-duty trucks, construction equipment, motorcycles, marine vessels, etc.

Figure 1B:
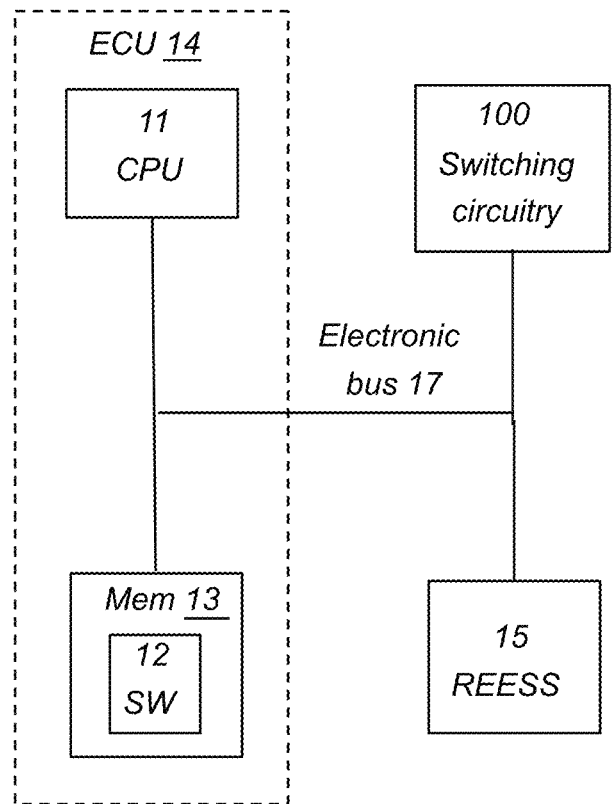
FIG. 1B shows an exemplary system diagram of a computer system with which the truck of FIG. 1A is equipped according to the present disclosure.

FIG. 1B shows an exemplary system diagram of the computer system 14 with which the truck 10 of FIG. 1A is equipped according to the present disclosure. The computer system 14 will in the following be exemplified by an ECU.

The ECU 14 generally comprises processing circuitry 11 embodied in the form of one or more microprocessors arranged to execute a computer program (SW) 12 downloaded to a storage medium (Mem) 13 associated with the microprocessor, such as a Random Access Memory (RAM), a Flash memory or a hard disk drive. The processing circuitry 11 is arranged to cause the ECU 14 to perform desired operations when the appropriate computer program 12 comprising computer-executable instructions is downloaded to the storage medium 13 and executed by the processing circuitry 11. The storage medium 13 may also be a computer program product comprising the computer program 12. Alternatively, the computer program 12 may be transferred to the storage medium 13 by means of a suitable computer program product, such as a Digital Versatile Disc (DVD) or a memory stick. As a further alternative, the computer program 12 may be downloaded to the storage medium 13 over a network. The processing circuitry 11 may alternatively be embodied in the form of a digital signal processor (DSP), an application specific integrated circuit (ASIC), a field-programmable gate array (FPGA), a complex programmable logic device (CPLD), etc. The processing circuitry 11 will in the following be referred to as a central processing unit (CPU).

Further shown in FIG. 1B is the above mentioned REESS 15 arranged to provide electric energy for electric propulsion of the truck 10.

Communication between the various components may occur via an electronic communication bus 17 such as e.g., a Controller Area Network (CAN) bus, a Local Interconnect Network (LIN) bus, an Ethernet bus, etc. Also shown in FIG. 1B is a switching circuitry 100 to be more described in the following.

Figure 2:
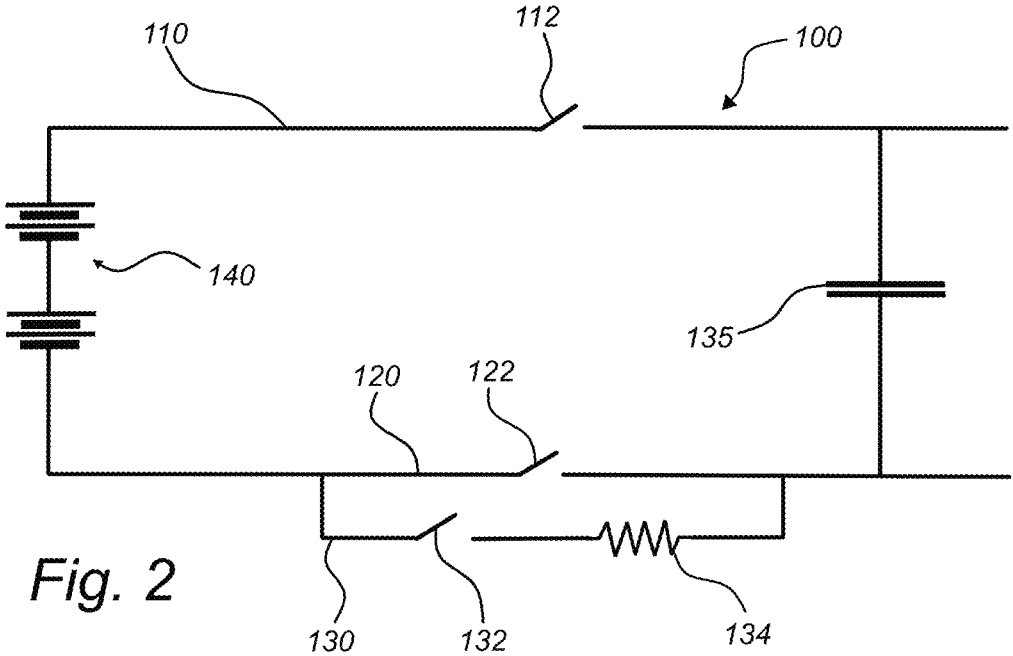
FIG. 2 shows a switching circuitry circuit utilized for performing the method according to aspects and examples of the present disclosure.

FIG. 2 shows the switching circuitry 100 utilized for performing a method according to a first aspect of the present disclosure. The switching circuitry 100 comprises a first path 110 comprising a first switch 112 configured to be controlled to selectively connect battery 140 comprised in the above-discussed REESS 15 to a load (not shown), a second path 120 comprising a second switch 122 configured to be controlled to selectively connect the battery 140 to the load, a third path 130 comprising a third switch 132 configured to selectively connect the battery 140 to the load and a resistor 134 in series with the third switch 132, the third path 130 being connected in parallel with the second path 120. The first 112, second 122, and third switch 132 may be controlled by the ECU 14. The load may be an electric machine for propelling the vehicle 10 as well as electrically driven auxiliary equipment of the vehicle 10.

The switching circuitry 100 may comprise a capacitor 135 arranged in parallel with the load whereby a circuit commonly referred to as a pre-charge circuit is formed. Thus, closing of the first switch 112, opening of the second switch 122, and closing of the third switch 132 are performed during power-up of the vehicle 10 as part of a pre-charge operation. When the second switch 122 closes, the switching circuitry 100 transitions into a current conducting state at which moment an inrush current may occur. The inrush current may risk damaging system components such as causing contactors to weld together.

By closing the first switch 112 and the third switch 132 and opening the second switch 122, the current is directed through the resistor 134 to gradually charge the capacitor 135. The resistor 134 thereby suppresses any peaks in the inrush current and/or voltage caused by the battery 140 and enables a smooth charging of the capacitor 135. After some time, the current and voltage will stabilize whereby the third switch 132 may be opened and the second switch 122 may be closed for providing electric energy for operation of the vehicle 10.

Figure 3:
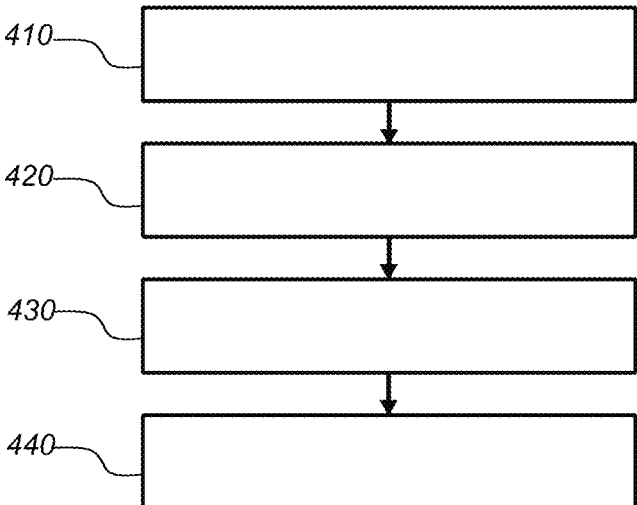
FIG. 3 illustrates the method according to the first aspect of the present disclosure.

FIG. 3 illustrates the method according to a first aspect of the present disclosure. The method may be carried out by a device such as the ECU 14 in a second aspect. Thus the ECU 14 closes the first switch 112 and opens the second switch 122 in 410 and closes in 420 the third switch 132. The actions in 410 and 420 are analogous to performing the pre-charge operation as discussed with reference to FIG. 2. Hence, the actions of 410 and 420 may advantageously be performed simultaneously as the pre-charge operation of the vehicle 10. The change in current and/or voltage to be suppressed in the pre-charge operation will generally occur just after the closing the third switch 132, with a certain delay.

Figure 4:
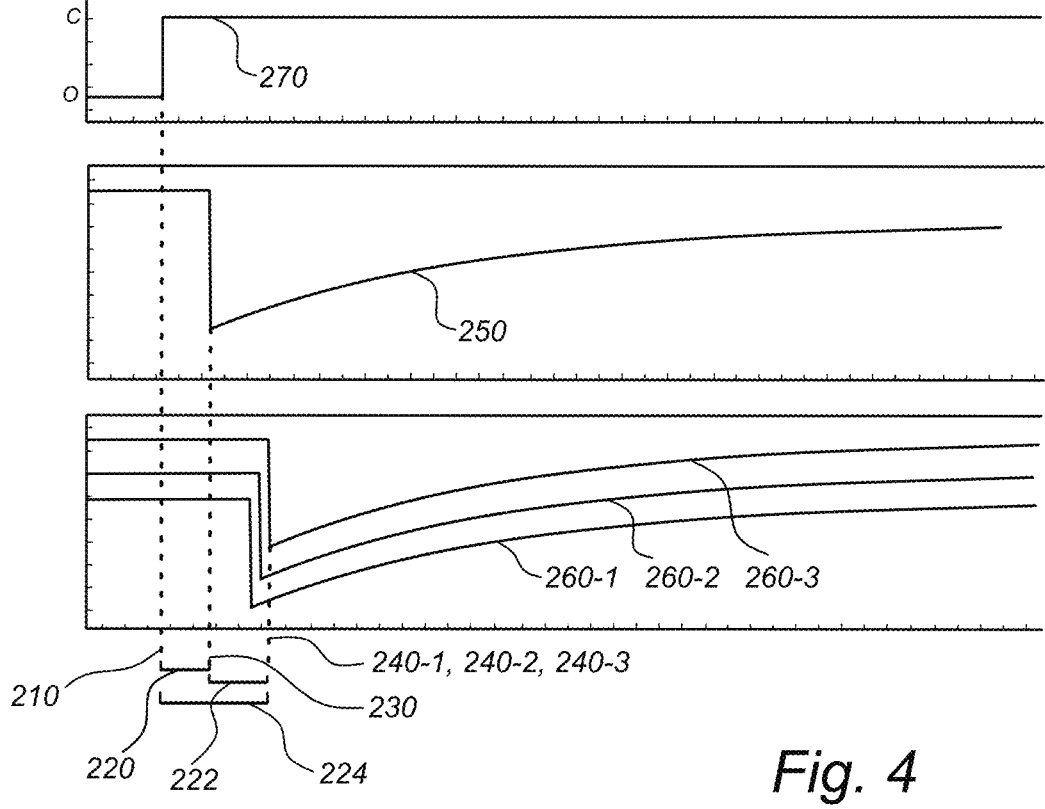
FIG. 4 is a set of graphs illustrating the signal delays according to aspects and examples of the present disclosure.

FIG. 4 is a set of graphs illustrating signal delays 220, 222, 224 according to examples of the present disclosure. The upper graph 270 illustrates the third switch 132 being open O or closed C, while the middle graph illustrates the change in current 250 through the battery 140 as a result of the third switch 132 closing and the lower graph illustrates a change in voltage 260-1, 260-2, 260-3 over three cells in the battery 140. In practice, the battery 140 typically comprises tens of cells.

Again with reference to FIG. 3, the ECU thereafter detects in 430 a change in an electric property—such as the current and/or voltage as discussed above—of the battery 140 in response to the closing of the third switch 132 and determines in 440 a delay 220, 222, 224 in the electric property in response to the closing of the third switch 132. As mentioned, in this particular example, a change is detected in both current and voltage of the battery. However, it may well be assumed that a change is detected in only one of these electric properties.

The change may be observed by any suitable measurements means, as will be apparent for someone of ordinary skill in the art. For example, the change may be measured by one or more sensors, such as a voltage sensor and/or a current sensor. In some examples, the current 250 passing through the resistor 134 may be indirectly detected by measuring the voltage 260-1, 260-2, 260-3 over the resistor 134, and calculating the current 250 value by taking into account a known resistance value of the resistor 134. Steps 430 and 440 of the method will now be further be explained with reference to FIG. 4.

With reference to FIG. 4, illustrated signal delays 220, 222, 224 according to examples of the present disclosure will be described in more detail. As discussed above, a change in battery current and voltage will occur in response to the switching circuitry 100 transitioning into a current conducting state, i.e. upon closing the third switch 132. In an ideal situation, the change would be detected at the time instance of closing the third switch 132. However, due to e.g. the current and voltage being measured with separate sensors, general delays and latencies in the system, hardware changes, software updates, etc., asynchronization between cell voltage and current acquisitions may occur, and the change will be detected with some delay. In some examples, the change may occur at a second time instance 230 or at a or third 240 time instance with respect to a first time instance 210 at which the third switch 132 is closed. As is understood, upon determining the delay for three different cells, the ECU 14 will typically monitor three different time instances 240-1, 240-2, 240-3 at which the change occurs, resulting in a slightly different delay for each cell. Consequently, the signal delay 220, 222, 224 may be derived by comparing the first time instance 210 of closing the third switch 132 and the second 230 and/or third 240 time instances of detecting the change, as will now be exemplified with reference to examples of the present disclosure.

In some examples, the change may be represented by a peak in current 250 passing through the resistor 134, the current 250 being detected at a second time instance 230. The signal delay 220 may then be determined by computing a time difference between the first time instance 210 and the second time instance 230. The corresponding signal delay 220 thus represents the delay between requesting a measurement of the current 250 (as effected by closing the third switch 132) to actually acquiring the measurement of the current 250.

In some examples, the change may be represented by peak in voltage 260 over the battery 140, the change in the voltage 260 may be measured at a third time instance 240. The signal delay 224 may then be determined for signals passing through the battery 130 by computing a time difference between the first time instance 210 and the third time instance 240. The corresponding signal delay 224 may represent the delay between requesting of a measurement of the voltage 260 to acquiring the measurement of the voltage 260.

In some examples, a set of voltages 260-1, 260-2, 260-3 may be detected for an individual cell of the battery 140, each change in the voltages 260-1, 260-2, 260-3 may be measured at a respective third time instance 240-1, 240-2, 240-3. Each respective third time instance 240-1, 240-2, 240-3 is collectively represented by a single dotted line in FIG. 4. However, it is understood that each respective third time instance 240-1, 240-2, 240-3 may be different from each other, as discussed hereinabove.

The signal delay 224 may then be determined for signals passing through the battery 130 by computing a time difference between the first time instance 210 and any of the third time instances 240-1, 240-2, 240-3. The corresponding signal delay 224 may represent the delay between transmitting a request of a measurement of the voltage 260 from a sensor to acquiring the measurement of the voltage 260 of a cell.

The signal delay (not shown) may further be determined by computing a time difference between the respective third time instances 240-1, 240-2, 240-3. Said signal delay may represent the delay between acquiring the measurement of the voltage 260-1, 240-2, 240-3 from a first cell and acquiring the measurement of the voltage 260-1, 240-2, 240-3 from a cell different from the first cell.

In some examples, the change may be represented by peak in voltage 260 over the battery 140 measured at a third time instance 240, and a peak in current 250 passing through the resistor 134 detected at a second time instance 230. The signal delay 222 may then be determined by computing a time difference between the second time instance 230 and the third time instance 240. The corresponding signal delay 222 may represent the delay between acquiring the measurement of the voltage 260 and acquiring the measurement of the current 250.

Furthermore, if the voltage is detected for an individual cell of the battery 140 at a respective third time instance 240-1, 240-2, 240-3, the corresponding signal delay 222 may represent the delay between acquiring the measurement of the voltage 260-1, 240-2, 240-3 for an individual cell and acquiring the measurement of the current 250.

In some examples, the ECU 14 may compute a compensated electrical property of the battery 140 from the detected electric property and the signal delay delays 220, 222, 224. As an example, a measurement of current I 250 at a second time instance t2 230 and a measurement of voltage V 260 at a third time instance t3 240, will yield a signal delay Dt=t3−t2 222. Upon the ECU 14 calculating an electrical parameter, such as electrical power P=V(t3)*I(t2), by using any of the obtained current 250 and voltage 260, the ECU 14 may compensate for the signal delay by predicting the value of the current I 250 at the third time instance t3 or voltage 260 of the second time instance t2. The prediction may be used by a suitable model, such as a machine learning model. A compensated electrical property, such as a compensated electrical power P=V(t3−Dt)*I(t2), may thereby be obtained.

In another example, the change is detected as soon as the corresponding electric property exceeds a set threshold value T. For instance, a threshold current value TI is set for the current, while a threshold voltage value TU is set for the voltage measurement, which threshold values are set lower than the peak values of the respective electric property. Thus, the current and/or voltage does not necessarily have to reach peak value for a change to be detected, it is sufficient if the set threshold value is exceeded.

Again with reference to FIG. 3, the method may further comprise a step of providing an alert upon the signal delay exceeding a threshold. The alert may be presented to a user of the vehicle 10 through a human-machine interface (HMI), such as a display screen disposed in the vehicle 10. The alert may further be sent to a remote platform such as a cloud-based service for fleet management, or a remote station to be reviewed by a maintenance crew. Upon providing the alert, the corrective measures may be taken such as performing maintenance on the vehicle 10 or providing a compensation for the excessive delay upon using the measurements for performing further computations in the ECU 14.

Example 1: An electronic control unit (14) configured to monitor signal delay (220, 222, 224) at a battery (140) of a vehicle (10) by utilizing a switching circuitry (100), the switching circuitry (100) comprising:

a first path (110) comprising a first switch (112) configured to be controlled to selectively connect the battery (140) to a load;

a second path (120) comprising a second switch (122) configured to be controlled to selectively connect the battery (140) to the load;

a third path (130) comprising a third switch (132) configured to selectively connect the battery (140) to the load and a resistor (134) in series with the third switch (132), the third path (130) being connected in parallel with the second path (120); electronic control unit (14) being configured to:

close (410) the first switch (112) and opening the second switch (122);

close (420) the third switch (132);

detect (430) a change in an electric property of the battery (140) in response to the closing of the third switch (132);

determine (440) the signal delay (220, 222, 224) by determining a delay in the detected change in the electric property in response to the closing of the third switch (132).

Example 2. The electronic control unit (14) of example 1, wherein the third switch (132) is being closed at a first time instance (210), and the change is represented by a peak in current (250) passing through the resistor (134), the current (250) being detected at a second time instance (230).

Example 3. The electronic control unit (14) of example 1, wherein the third switch (132) is being closed at a first time instance (210), and the change is represented by the current (250) passing through the resistor (134) exceeding a set current threshold value, the current (250) being detected at a second time instance (230).

Example 4. The electronic control unit (14) of examples 2 or 3, further being configured to, when determining (440) the signal delay (220, 222, 224):

determine the signal delay (220) by computing a time difference between the first time instance (210) and the second time instance (230).

Example 5. The electronic control unit (14) of any of the preceding examples, wherein the third switch (132) is being closed at a first time instance (210), and the change is represented by peak in voltage (260-1, 260-2, 260-3) over the battery (140), the change in the voltage (260-1, 260-2, 260-3) is measured at a third time instance (240-1, 240-2, 240-3).

Example 6. The electronic control unit (14) of any one of examples 1-4, wherein the third switch (132) is being closed at a first time instance (210), and the change is represented by the voltage (260-1, 260-2, 260-3) over the battery (140) exceeding a set voltage threshold value, the voltage (260-1, 260-2, 260-3) being detected at a second time instance (230).

Example 7. The electronic control unit (14) of examples 6 or 7, further being configured to, when determining (440) the signal delay (220, 222, 224):

determine the signal delay (224) by computing a time difference between the first time instance (210) and the third time instance (240-1, 240-2, 240-3).

Example 8. The electronic control unit (14) of any of examples 2 or 3 and 4 or 5, further being configured to, when determining (440) the signal delay (220, 222, 224):

determine the signal delay (222) by computing a time difference between the second time instance (230) and the third time instance (240-1, 240-2, 240-3).

Example 9. The electronic control unit (14) of any of examples 5-7, wherein the voltage (260-1, 260-2, 260-3) is detected for an individual cell of the battery (140).

Example 10. The electronic control unit (14) of examples 2 or 3, the current (250) passing through the resistor (134) being indirectly detected by measuring the voltage (260-1, 260-2, 260-3) over the resistor (134) and taking into account a known resistance value of the resistor (134).

Example 11. The electronic control unit (14) of any of the preceding examples, the switching circuitry (100) further comprising a capacitor (135) arranged in parallel with the load, thereby forming a pre-charge circuit.

Example 12. The electronic control unit (14) of any of the preceding examples, whereby the closing (410) of the first switch (112), the opening of the second switch (122), and the closing (420) of the third switch (132) are performed during power-up of the vehicle (10) as part of a pre-charge operation.

Example 13. The electronic control unit (14) of any of the preceding examples, further being configured to:

provide an alert upon the signal delay (220, 222, 224) exceeding a delay threshold.

Example 14. A method of monitoring signal delay at a battery (140) of a vehicle (10) by utilizing a switching circuitry (100), the switching circuitry (100) comprising:

a first path (110) comprising a first switch (112) configured to be controlled to selectively connect the battery (140) to a load;

a second path (120) comprising a second switch (122) configured to be selectively connect the battery (140) to the load;

a third path (130) comprising a third switch (132) configured to selectively connect the battery (140) to the load and a resistor (134) in series with the third switch (132), the third path (130) being connected in parallel with the second path (120); the method comprising:

closing (410) the first switch (112) and open the second switch (122);

closing (420) the third switch (132);

detecting (430) a change in an electric property of the battery (140) in response to the closing of the third switch (132);

determining (440) the signal delay (220, 222, 224) by determining a delay in the detected change in the electric property in response to the closing of the third switch (132).

Example 15. The method of example 14, wherein the third switch (132) is being closed at a first time instance (210), and the change is represented by a peak in current (250) passing through the resistor (134), the current (250) being detected at a second time instance (230).

Example 16. The method of example 14, wherein the third switch (132) is being closed at a first time instance (210), and the change is represented by the current (250) passing through the resistor (134) exceeding a set current threshold value, the current (250) being detected at a second time instance (230).

Example 17. The method of examples 15 or 16, the determining (440) further comprising:

determining the signal delay (220) by computing a time difference between the first time instance (210) and the second time instance (230).

Example 18. A vehicle (10) comprising the electronic control unit (14) of examples 1-13.

Example 19. A computer program product comprising program code (13) for performing, when executed by the electronic control unit (14), the method of examples 14-17.

Example 20. A non-transitory computer-readable storage medium (12) comprising instructions (13), which when executed by the electronic control unit (14), cause the electronic control unit (14) to perform the method of examples 14-17.

The terminology used herein is for the purpose of describing particular aspects only and is not intended to be limiting of the disclosure. As used herein, the singular forms "a," "an," and "the" are intended to include the plural forms as well, unless the context clearly indicates otherwise. As used herein, the term "and/or" includes any and all combinations of one or more of the associated listed items. It will be further understood that the terms "comprises," "comprising," "includes," and/or "including" when used herein specify the presence of stated features, integers, actions, steps, operations, elements, and/or components, but do not preclude the presence or addition of one or more other features, integers, actions, steps, operations, elements, components, and/or groups thereof.

It will be understood that, although the terms first, second, etc., may be used herein to describe various elements, these elements should not be limited by these terms. These terms are only used to distinguish one element from another. For example, a first element could be termed a second element, and, similarly, a second element could be termed a first element without departing from the scope of the present disclosure.

Relative terms such as "below" or "above" or "upper" or "lower" or "horizontal" or "vertical" may be used herein to describe a relationship of one element to another element as illustrated in the Figures. It will be understood that these terms and those discussed above are intended to encompass different orientations of the device in addition to the orientation depicted in the Figures. It will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this disclosure belongs. It will be further understood that terms used herein should be interpreted as having a meaning consistent with their meaning in the context of this specification and the relevant art and will not be interpreted in an idealized or overly formal sense unless expressly so defined herein.

It is to be understood that the present disclosure is not limited to the aspects described above and illustrated in the drawings; rather, the skilled person will recognize that many changes and modifications may be made within the scope of the present disclosure and appended claims. In the drawings and specification, there have been disclosed aspects for purposes of illustration only and not for purposes of limitation, the scope of the disclosure being set forth in the following claims.

What is claimed is:

1. An electronic control unit configured to monitor signal delay at a battery of a vehicle by utilizing a switching circuitry, the switching circuitry comprising:

a first path comprising a first switch configured to be controlled to selectively connect the battery to a load;

a second path comprising a second switch configured to be controlled to selectively connect the battery to the load;

a third path comprising a third switch configured to selectively connect the battery to the load and a resistor in series with the third switch, the third path being connected in parallel with the second path; electronic control unit being configured to:

close the first switch and open the second switch;

close the third switch;

detect a change in an electric property of the battery in response to the closing of the third switch;

determine the signal delay by determining a delay in the detected change in the electric property in response to the closing of the third switch.

2. The electronic control unit of claim 1, wherein the third switch is being closed at a first time instance, and the change is represented by a peak in current passing through the resistor, the current being detected at a second time instance.

3. The electronic control unit of claim 1, wherein the third switch is being closed at a first time instance, and the change is represented by the current passing through the resistor exceeding a set current threshold value, the current being detected at a second time instance.

4. The electronic control unit of claim 2, further being configured to, when determining the signal delay:

determine the signal delay by computing a time difference between the first time instance and the second time instance.

5. The electronic control unit of claim 1, wherein the third switch is being closed at a first time instance, and the change is represented by peak in voltage over the battery, the change in the voltage is measured at a third time instance.

6. The electronic control unit of claim 1, wherein the third switch is being closed at a first time instance, and the change is represented by the voltage over the battery exceeding a set voltage threshold value, the voltage being detected at a second time instance.

7. The electronic control unit of claim 6, further being configured to, when determining the signal delay:

determine the signal delay by computing a time difference between the first time instance and the third time instance.

8. The electronic control unit of claim 2, further being configured to, when determining the signal delay:

determine the signal delay by computing a time difference between the second time instance and the third time instance.

9. The electronic control unit of claim 5, wherein the voltage is detected for an individual cell of the battery.

10. The electronic control unit of claim 2, the current passing through the resistor being indirectly detected by measuring the voltage over the resistor and taking into account a known resistance value of the resistor.

11. The electronic control unit of claim 1, the switching circuitry further comprising a capacitor arranged in parallel with the load, thereby forming a pre-charge circuit.

12. The electronic control unit of claim 1, whereby the closing of the first switch, the opening of the second switch, and the closing of the third switch are performed during power-up of the vehicle as part of a pre-charge operation.

13. The electronic control unit of claim 1, further being configured to:

provide an alert upon the signal delay exceeding a delay threshold.

14. A method of monitoring signal delay at a battery of a vehicle by utilizing a switching circuitry, the switching circuitry comprising:

a first path comprising a first switch configured to be controlled to selectively connect the battery to a load;

a second path comprising a second switch configured to be selectively connect the battery to the load;

a third path comprising a third switch configured to selectively connect the battery to the load and a resistor in series with the third switch, the third path being connected in parallel with the second path; the method comprising:

closing the first switch and opening the second switch;

closing the third switch;

detecting a change in an electric property of the battery in response to the closing of the third switch;

determining the signal delay by determining a delay in the detected change in the electric property in response to the closing of the third switch.

15. The method of claim 14, wherein the third switch is being closed at a first time instance, and the change is represented by a peak in current passing through the resistor, the current being detected at a second time instance.

16. The method of claim 14, wherein the third switch is being closed at a first time instance, and the change is represented by the current passing through the resistor exceeding a set current threshold value, the current being detected at a second time instance.

17. The method of claim 15, the determining further comprising:

determining the signal delay by computing a time difference between the first time instance and the second time instance.

18. A vehicle comprising the electronic control unit of claim 1.

19. A computer program product comprising program code for performing, when executed by the electronic control unit, the method of claim 14.

20. A non-transitory computer-readable storage medium comprising instructions, which when executed by the electronic control unit, cause the electronic control unit to perform the method of claim 14.

*     *     *     *     *